(12) United States Patent
Motomura

(10) Patent No.: US 7,517,560 B2
(45) Date of Patent: Apr. 14, 2009

(54) METHOD OF MANUFACTURING SUBSTRATE HAVING RESIST FILM

(75) Inventor: Shuhou Motomura, Kumamoto (JP)

(73) Assignee: Hoya Corporation, Tokyo (JP)

( * ) Notice: Subject to any disclaimer, the term of this patent is extended or adjusted under 35 U.S.C. 154(b) by 742 days.

(21) Appl. No.: 11/092,989

(22) Filed: Mar. 30, 2005

(65) Prior Publication Data

US 2005/0227014 A1  Oct. 13, 2005

(30) Foreign Application Priority Data

Mar. 30, 2004  (JP) .......................... P.2004-100911

(51) Int. Cl.
*B05D 1/18*  (2006.01)

(52) U.S. Cl. ................... 427/434.5; 427/434.2

(58) Field of Classification Search .............. 427/434.5, 427/434.2; 118/401
See application file for complete search history.

(56) References Cited

U.S. PATENT DOCUMENTS

| 5,654,041 A | * | 8/1997 | Appich et al. ............. 427/434.5 |
| 2003/0064159 A1 | * | 4/2003 | Motomura ................ 427/372.2 |

FOREIGN PATENT DOCUMENTS

JP  2001-62370 A  3/2001

* cited by examiner

*Primary Examiner*—Roberts Culbert
(74) *Attorney, Agent, or Firm*—Sughrue Mion, PLLC

(57) ABSTRACT

The height H of a liquid level, a capillary gap distance T, and a relative scanning speed between a coating nozzle 22 and a surface 10*a*, which is to be coated, are adjusted within an adjustable range by simultaneously setting the thickness of a coating film 21*a* formed of a resist agent at a predetermined value. Thus, a coating gap G is widen.

9 Claims, 7 Drawing Sheets

METHOD OF MANUFACTURING SUBSTRATE HAVING RESIST FILM

BACKGROUND OF THE INVENTION

The present invention relates to a method of manufacturing a substrate provided with a resist film by coating a resist agent on a substrate to thereby form the resist film on the substrate and manufacture, for example, a photomask.

Hitherto, there has been proposed a method of manufacturing a substrate provided with a resist film by coating onto a substrate a resist agent, which is used for forming a resist film, such as a photoresist, on a substrate, such as a silicon wafer, thereby to manufacture the substrate having the resist film. Also, a coating apparatus (or a coater) has been proposed as an apparatus for coating such a resist agent.

What is called a spin coater is known as a conventional coating apparatus. This spin coater spreads a resist agent on a surface, which is to be coated, by the action of a centrifugal force by rotating this substrate in a horizontal plane at a high speed after liquid resist agent is dropped a central portion of a surface of a horizontally supported substrate, which is to be coated. Thus, the spin coater forms a coating film on the entire surface to be coated.

However, such a spin coater has the problem that a projection made of a resist agent, which is referred to as a "fringe", is produced in a peripheral edge portion of the substrate. When such a fringe is produced, the thickness of the resist film formed of the coated resist agent becomes uneven. Further, such a fringe is liable to be produced, especially, in a large substrate, such as a substrate of a liquid crystal display apparatus and a photomask substrate for manufacturing a liquid crystal display apparatus, the length of which is equal to or more than, for example, 300 nm.

In recent years, in a liquid crystal display apparatus, and a photomask for manufacturing a liquid crystal display apparatus, the degree of a pattern formed therein is enhanced. Thus, techniques enabled to form a resist film having a uniform thickness on the entire surface of a large substrate are desired. That is, in a case where the resist film has a film thickness distribution, in-plane variation of precision of turn-processing, which is performed by using a resist pattern formed of the resist film as a mask, is caused.

In view of such circumstances, a coating apparatus, which is commonly called a "CAP coater", as described in a Patent Document 1, has been proposed. In this "CAP coater", a coating nozzle having a capillary-tube-like gap is preliminarily sunk in a liquid tank in which liquid resist agent is stored. Meanwhile, a substrate is held in a position, in which a surface to be coated is downwardly directed, by a suction table. Subsequently, the coating nozzle is lifted from the resist agent so that the top portion thereof is placed close to the substrate surface to be coated. Then, the liquid resist agent stored in the liquid tank is raised due to a capillary phenomenon caused in the coating nozzle, so that this resist agent contacts the substrate surface, which is to be coated, through the top portion of the coating nozzle. Thus, a coating film is formed on the entire surface, which is to be coated, by causing the coating nozzle to perform a relative scan on the entire surface in a state in which this resist agent contacts the surface to be coated.

More concretely, this coating apparatus has a control portion for adjusting the height positions of the liquid tank and the coating nozzle. This control portion first raises both the liquid tank, in which the resist agent is stored so that the liquid level of the resist agent reaches a predetermined liquid level position, and the coating nozzle, which is completely sunk in this resist agent, and causes both the liquid tank and the coating nozzle to approach the substrate surface, which is to be coated, from below. Subsequently, the control portion stops the rise of the liquid tank to thereby project the top side of the coating nozzle upwardly from the liquid level of the resist agent. At that time, the coating nozzle being completely sunk in the resist agent is projected upwardly from the liquid level of this resist agent. Thus, the capillary gap is filled with the resist agent.

Subsequently, the control portion raises the liquid tank together with the coating nozzle again to thereby cause the resist agent at the top portion of the coating nozzle to contact the substrate surface to be coated. Then, the control portion stops the rise of each of the liquid tank and the coating nozzle. That is, the control portion stops the liquid tank and the coating nozzle in a state in which the resist agent filling up the capillary gap of the coating nozzle is brought into contact with the surface to be coated.

Subsequently, the control portion causes the liquid tank and the coating nozzle to descend to a predetermined "coating height" position in a state in which the resist agent contacts the substrate surface to be coated at the top portion of the coating nozzle. In this state, the control portion moves the substrate along the surface direction and causes the top portion of the coating nozzle to scan the entire surface to be coated, thereby to form a resist agent coating film over the entire surface to be coated.

According to the manufacturing method using such a coating apparatus, a resist film having a uniform thickness can be formed over the entire surface of the substrate without producing a fringe on the peripheral edge portion of the substrate.

[Patent Document 1]
   JP-A-2001-62370.

Meanwhile, even when the aforementioned coating apparatus commonly called "CAP coater" is used, the uniformity of the thickness of the resist film is sometimes insufficient in a case where the high precision of the pattern formed on the substrate is required.

However, hitherto, it has not been studied whether or not a coating film having a small film thickness distribution rate (to be described later) can be formed and the uniformity of the thickness of the resist film can be enhanced in a case where the resist agent is applied by using such a coating apparatus.

SUMMARY OF THE INVENTION

Accordingly, the invention is proposed in view of the aforementioned circumstances. An object of the invention is to provide a method of manufacturing a substrate having a resist film, which is enabled to reduce the film thickness distribution rate thereof while the thickness of the resist film is set to a predetermined value, and also enabled to enhance the uniformity of the thickness of the resist film in a case where the resist agent is applied thereto by using a coating apparatus commonly called a "CAP coater".

The inventor of the present invention advanced researches so as to solve the problems. Consequently, the inventor found that in a case where the resist agent is coated to the substrate by using the coating apparatus commonly called the "CAP coater", a parameter determining the distribution of the thickness of the coating film is the distance between the substrate and the top portion of the coating nozzle, that is, a coating gap, and that the larger the coating gap, the smaller the film thickness distribution rate thereof.

That is, in a case where let G denote the coating gap, and where let G' designate a separation gap at which the resist agent having once contacted the surface to be coated is separated therefrom, it is necessary that the coating gap G is less than the separation gap G'. Further, the inventor of the present invention found that it is preferable to increase the coating gap G as much as possible in a state in which the coating gap G is less than the separation gap G'. However, when the coating gap G is simply increased, there is caused the problem that the resist agent having once contacted the surface to be coated becomes liable to be separated therefrom.

Thus, the inventor of the present invention conducted a study on techniques for increasing the coating gap G. To increase the coating gap G without separating the resist agent from the surface to be coated (that is, without being out of the resist agent), the reduction of the friction between the coating nozzle and the resist agent, which is caused during the discharge of the resist agent from the coating nozzle, is needed. It is necessary for reducing such friction between the coating nozzle and the resist agent to increase the distance (hereunder referred to as a capillary gap distance T) of the capillary gap of the coating nozzle, through which the resist agent rises. Moreover, it is also necessary for reducing such friction to decrease the height (hereunder referred to as a liquid level height H) to the top of the coating nozzle from the liquid level of the resist agent at the coating.

Meanwhile, in addition to the coating gap G, the capillary gap distance T, and the liquid level height H, the relative scanning speed V between the coating nozzle and the coated surface of the substrate and the viscosity of the resist agent are cited as parameters for controlling the thickness of the coating film, with which the resist agent is coated.

FIGS. 1A to 1E are graphs each illustrating the relation between the thickness of the coating film and an associated one of parameters that affects the thickness of the coating film.

As shown in FIG. 1A, the relative speed V between the coating nozzle and the surface of the coating film, which is to be coated, has a relation with the thickness of the coating film so that the higher the speed, the thicker the film thickness. As shown in FIG. 1B, the relation between the capillary gap distance T and the thickness of the coating film is such that the larger the capillary gap distance T, the thicker the film thickness. As shown in FIG. 1D, the relation between the viscosity of the resist agent and the thickness of the coating film is such that the higher the viscosity, the thicker the film thickness. As shown in FIG. 1E, the relation between the liquid level height H And the thickness of the coating film is such that the higher the liquid level height H, the thicker the film thickness.

Further, as shown in FIG. 1C, the relation between the coating gap G and the thickness of the coating film is such that the wider the coating gap G, the thicker the film thickness. However, as described above, this coating gap G should be set from the viewpoint of suppressing the film thickness distribution rate thereof, instead of the viewpoint of the film thickness.

The absolute distance of the coating gap G (incidentally, the coating gap G is assumed to be set so that the resist agent is not separated from the surface to be coated) can be increased by reducing the friction between the resist agent, which rises through the capillary gap, and the coating nozzle. A method of increasing a capillary gap distance T, a method of reducing a liquid level height, and a method of increasing the viscosity of the resist agent are considered as the method of reducing the friction of the resist agent rising through the capillary gap. However, in a case where the viscosity of the resist agent is practically fixed, the method of increasing the capillary gap distance T and the method of reducing the liquid level height H are employed. According to the invention, the capillary gap distance T and the liquid level height H are selected so that the coating gap has a desired large value. Further, according to the invention, the film thickness is controlled according to, another parameter, which is the relative scanning speed V between the substrate and the coating nozzle.

The invention enables the increase of the coating gap G by setting the film thickness of the coating film at a predetermined value and also adjusting each of the capillary gap distance T, the liquid level height H, and the scanning speed V in an adjustable range. Consequently, the film thickness distribution rate can be improved.

Further, according to the invention, the coating gap G can be set at a value, at which the film thickness distribution rate has a favorable value within, for example, 1% of the film thickness, on conditions that the capillary gap distance T and the liquid level height H meet the following inequality: (H/T) <45, that is, the liquid level height H is set in such a way as to be less than 45 times the capillary gap distance T.

Further, although the favorable film thickness distribution rate of the coating film can be obtained by increasing the coating gap G, as described above, it is preferable for obtaining a further favorable film thickness distribution rate, which is within 1% of an average film thickness, that the coating gap G is set to be equal to or more than 200 µm. It is desirable for obtaining a furthermore favorable film thickness distribution rate, which is within 0.75% of the average film thickness, that the coating gap G is set to be equal to or more than 250 µm. Additionally, it is desirable for obtaining a furthermore favorable film thickness distribution rate, which is within 0.5% of the average film thickness, that the coating gap G is set to be equal to or more than 300 µm.

Further, according to the invention, the thickness of the coating film can be set in such a way as to range from 200 nm to 2000 nm. It is preferable for forming a coating film having such a film thickness to set the relative scanning speed V between the surface of the substrate, which is to be coated, and the coating nozzle at a value ranging from 0.1 m/minute to 0.5 m/minute.

Incidentally, according to the invention, the substrate is a transparent substrate. A light shielding film made of a resist agent is formed on the transparent substrate to thereby form a resist film for using this transparent substrate as a photomask. Thus, a photomask can be manufactured as a substrate having a resist film.

That is, the method according to the invention has the following constitutions.

According to the first aspect of the invention, there is provided a method of manufacturing a substrate having a resist film including a resist agent coating steps of: raising liquid resist agent stored in a liquid tank by a capillary phenomenon caused in a coating nozzle, downwardly directing a surface of the substrate, which is to be coated, causing the surface to get close to a top portion of the coating nozzle with a predetermined coating gap therebetween, performing a relative scan between the coating nozzle and the surface while the resist agent raised by the coating nozzle being contacted to the surface thereby forming a coating film, wherein the coating gap is adjusted to a large value within an adjustable range by setting a height from a liquid level of the resist agent in the liquid tank to a top end of the coating nozzle to be reduced in an adjustable range, and/or setting a distance of a capillary gap, in which a capillary phenomenon is caused in the coating nozzle to be increased within an adjustable range, while a thickness of the coating film being set at a predetermined value.

Further, according to the second aspect of the invention, there is provided a method of manufacturing a substrate having a resist film according to the first aspect, wherein the height from the liquid level of the resist agent in the liquid tank to the top end of the coating nozzle is set to be equal to or more than the distance of the capillary gap, and to be less than 45 times the distance of the capillary gap.

Furthermore, according to the third aspect of the invention, there is provided a method of manufacturing a substrate having a resist film including a resist agent coating steps of: raising liquid resist agent stored in a liquid tank by a capillary phenomenon caused in a coating nozzle, downwardly directing a surface of the substrate, which is to be coated, causing the surface, to get close to a top portion of the coating nozzle with a predetermined coating gap therebetween, performing a relative scan between the coating nozzle and the surface while the resist agent raised by the coating nozzle being contacted to the surface thereby forming a coating film, wherein the substrate is a rectangle substrate, one of sides of which has a length that is equal to or more than 300 nm; and a thickness of the coating film is set at a value selected from a range from 200 nm to 2000 nm, and the coating gap is set to be equal to or more than 200 μm, so that a film thickness distribution rate of the coating film in a region, of which area is at least 70% of area of the substrate, is equal to or less than 1%.

Further, according to the fourth aspect of the invention, there is provided a method of manufacturing a substrate having a resist film including a resist agent coating steps of: raising liquid resist agent stored in a liquid tank by a capillary phenomenon caused in a coating nozzle, downwardly directing a surface of the substrate, which is to be coated, causing the surface to get close to a top portion of the coating nozzle with a predetermined coating gap therebetween, performing a relative scan between the coating nozzle and the surface while the resist agent raised by the coating nozzle being contacted to the surface thereby forming a coating film, wherein the substrate is a rectangle substrate, one of sides of which has a length that is equal to or more than 300 nm; and a thickness of the coating film is set at a value selected from a range from 200 nm to 2000 nm, and the coating gap is set to be equal to or more than 250 μm, so that a film thickness distribution rate of the coating film in a region, of which area is at least 70% of area of the substrate, is equal to or less than 0.75%.

Furthermore, according to the fifth aspect of the invention, there is provided a method of manufacturing a substrate having a resist film including a resist agent coating steps of: raising liquid resist agent stored in a liquid tank by a capillary phenomenon caused in a coating nozzle, downwardly directing a surface of the substrate, which is to be coated, and causing the surface to get close to a top portion of the coating nozzle with a predetermined coating gap therebetween, performing a relative scan between the coating nozzle and the surface while the resist agent raised by the coating nozzle being contacted to the surface thereby forming a coating film, wherein the substrate is a rectangle substrate, one of sides of which has a length that is equal to or more than 300 nm; and a thickness of the coating film is set at a value selected from a range from 200 nm to 2000 nm, and the coating gap is set to be equal to or more than 300 μm, so that a film thickness distribution rate of the coating film in a region, of which area is at least 70% of area of the substrate, is equal to or less than 0.5%.

Incidentally, a rectangle substrate is a square or rectangular substrate. In the case of a rectangular substrate, a shorter side thereof has a length of 300 nm or more.

Further, the film thickness distribution is calculated by the following equation according to results of measurement of the film thickness at different three points disposed in a region, the area of which is at least 70% of the substrate, by being evenly distributed therein.

The film thickness distribution rate $(\%) = (t_{max} - t_{min})/t_{ava} \times 100$, where $t_{max}$ designates a maximum value of the film thickness, $t_{min}$ denotes a minimum value thereof, and $t_{ava}$ designates an average value thereof. More preferably, in the case of a photomask and a device substrate, a measurement region is a pattern (or pixel) forming region.

Further, according to the sixth aspect, there is provided a method of manufacturing a substrate having a resist film according to one of the first to fifth aspects, wherein the substrate is a photomask blank that is a material of a photomask obtained by forming a light shielding pattern on a transparent substrate.

DETAILED DESCRIPTION OF THE PREFERRED EMBODIMENTS

Hereinafter, an embodiment of the invention is described by referring to the accompanying drawings.

Figure 2:
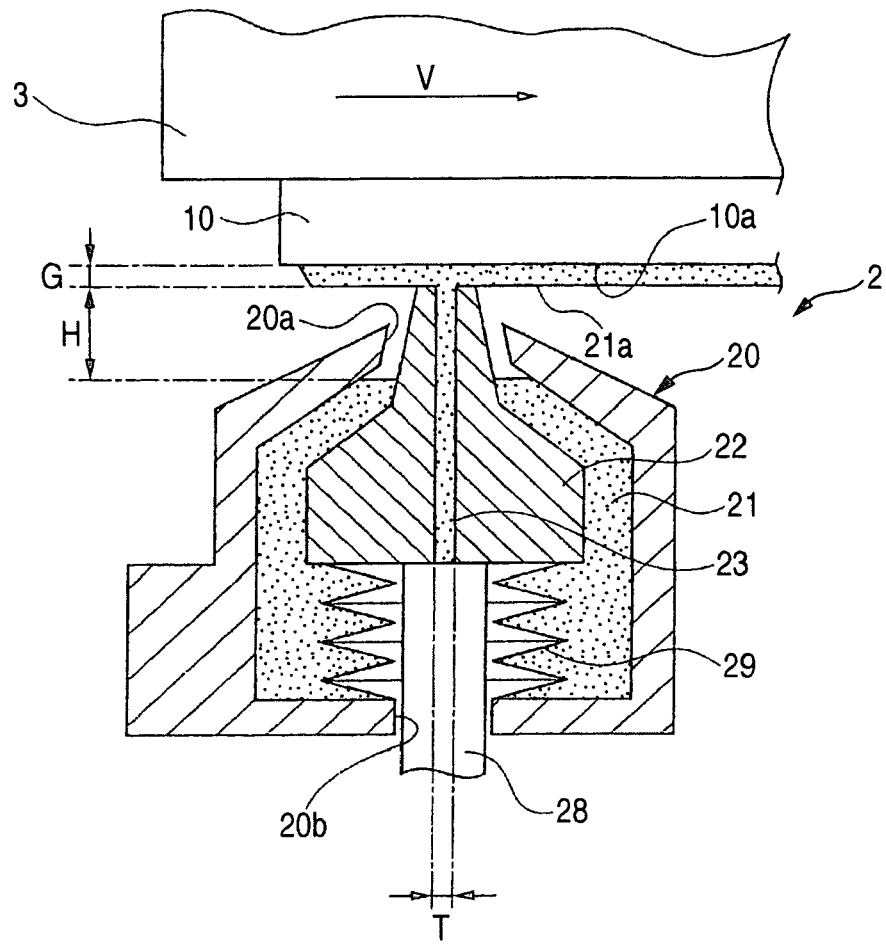
FIG. 2 is a cross-sectional view illustrating a state in which a coating operation is performed by a coating unit of a coating apparatus performing the method of manufacturing a substrate having a resist film according to the invention.

FIG. 2 is a cross-sectional view illustrating a state in which a coating operation is performed by a coating unit of a coating apparatus performing the method of manufacturing a substrate having a resist film according to the invention.

The method of manufacturing a substrate having a resist film according to the invention comprises the step of lifting liquid resist agent 21 stored in a liquid tank 20 by utilizing a capillary phenomenon caused in a slit-like capillary gap 23 of a coating nozzle 22, the step of downwardly directing a surface 10a of a substrate 10, which is to be coated, and causing this surface to move closer to the top portion of the coating nozzle 22, and the step of performing relative scan between the coating nozzle 22 and the surface 10a while causing the resist agent 21 raised by the coating nozzle 22 to wet the surface 10a through the top portion of the coating nozzle 22, thereby to coat the resist agent 21 onto the surface 10a. This manufacturing method is performed by using a coating apparatus commonly called a "CAP coater". The direction of the relative scan between the coating nozzle 22 and the surface 10a is perpendicular to the slit constituted by the capillary gap 23 in the top portion of the coating nozzle 22, as indicated by an arrow V shown in FIG. 2.

The inventor of the present invention found that a parameter affecting the film thickness distribution (that is, the unevenness of the film thickness) of the coating film 21a, which is used in the method of manufacturing a substrate having a resist film, is the distance of a gap (hereunder referred to as the coating gap G) provided between the surface 10a of the substrate 10 and the top portion of the coating nozzle 22, which is indicated by an arrow G shown in FIG. 2).

Figure 3:
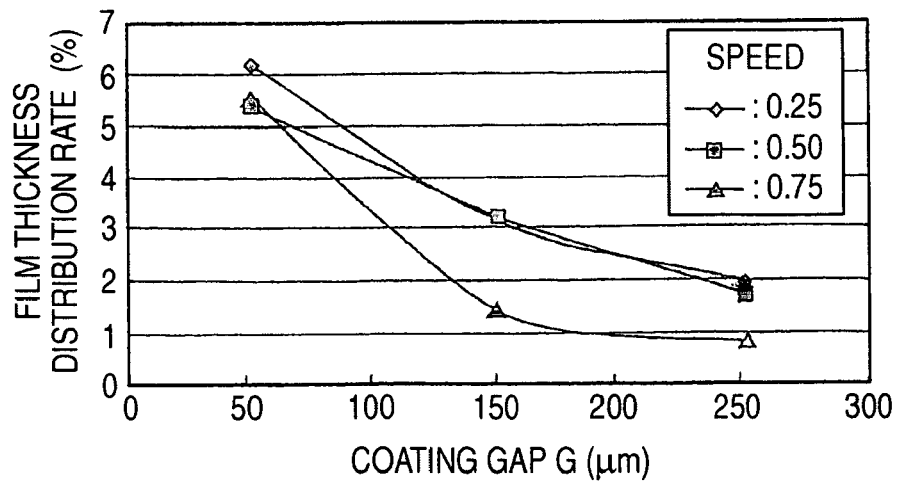
FIG. 3 is a graph illustrating the relation between the coating gap and the film thickness distribution rate in the method of manufacturing a substrate having a resist film according to the invention.

FIG. 3 is a graph illustrating the relation between the coating gap G and the film thickness distribution rate.

As shown in FIG. 3 and TABLE 1 listed below, the coating gap G and the film thickness distribution rate, which is such that as the coating gap G increases, the film thickness distribution rate decreases. Similar relation holds for a case where the relative scanning speed V between the coating nozzle 22 and the surface 10a is changed from 0.25 m/minute to 0.75 m/minute through 0.50 m/minute. Therefore, it is sufficient for obtaining the coating film 21a, which has a small film thickness distribution rate and a high uniformity of film thickness, to increase the coating gap G.

TABLE 1

| Speed | Gap (μm) | | |
|---|---|---|---|
| | 50 (nm) | 150 (nm) | 250 (nm) |
| 0.25 m/min. | 763.7 | 688.0 | 660.5 |
| | 757.4 | 709.6 | 667.0 |
| | 764.0 | 666.9 | 685.7 |
| | 785.2 | 669.1 | 676.6 |
| | 723.3 | 678.2 | 663.7 |
| | 732.9 | 675.8 | 661.3 |
| | 714.8 | 708.2 | 680.6 |
| | 694.4 | 689.4 | 668.9 |
| | 702.5 | 694.4 | 687.3 |
| | 757.7 | 667.7 | 661.8 |
| | 757.7 | 681.2 | 670.0 |
| | 701.8 | 685.3 | 673.1 |
| Average | 738.0 | 684.5 | 671.4 |
| Range | 908 | 427 | 268 |
| Variation (%) | 6.15 | 3.12 | 2.00 |
| 0.5 m/min. | 1169.2 | 1038.9 | 1042.9 |
| | 1169.2 | 1064.8 | 1037.8 |
| | 1154.9 | 1079.3 | 1034.3 |
| | 1154.4 | 1084.4 | 1026.2 |
| | 1182.0 | 1094.4 | 1036.3 |
| | 1183.9 | 1100.9 | 1039.3 |
| | 1190.0 | 1063.4 | 1048.9 |
| | 1205.6 | 1064.4 | 1034.9 |
| | 1233.8 | 1098.9 | 1038.5 |
| | 1226.2 | 1108.3 | 1062.6 |
| | 1283.9 | 1103.0 | 1037.8 |
| | 1259.1 | 1100.9 | 1045.4 |
| Average | 1201.0 | 1083.5 | 1040.4 |
| Range | 1295 | 694 | 364 |
| Variation (%) | 5.39 | 3.20 | 1.75 |
| 0.75 m/min. | 1556.7 | 1388.1 | 1388.8 |
| | 1557.4 | 1390.8 | 1342.2 |
| | 1610.9 | 1364.2 | 1343.6 |
| | 1597.0 | 1361.0 | 1341.7 |
| | 1648.9 | 1396.6 | 1355.0 |

TABLE 1-continued

| Speed | Gap (μm) | | |
|---|---|---|---|
| | 50 (nm) | 150 (nm) | 250 (nm) |
| | 1657.3 | 1389.2 | 1344.3 |
| | 1621.1 | 1381.0 | 1334.4 |
| | 1624.6 | 1388.2 | 1336.1 |
| | 1725.8 | 1386.5 | 1340.8 |
| | 1729.3 | 1372.5 | 1346.2 |
| | 1701.3 | 1356.3 | 1332.7 |
| | 1740.2 | 1360.8 | 1332.0 |
| Average | 1647.5 | 1377.9 | 1340.7 |
| Range | 1835 | 403 | 230 |
| Variation (%) | 5.57 | 1.46 | 0.86 |

Incidentally, the graph shown in FIG. 3 is based on data shown in TABLE 1. The thickness of the coating film 21a is measured at 12 measurement points (that is, 3×4 points) equally spaced in a central region, whose area is 390 mm×490 mm, of a substrate, whose area is 450 mm×550 mm, in each of 9 kinds of sample cases, in which the relative scanning speed V is changed from 0.25 m/min. to 0.75 m/min. through 0.50 m/min. corresponding to each of the values 50 μm, 150 μm, and 250 μm of the coating gap G. TABLE 1 shows the average of the results of these measurements and the film thickness distribution rates (or the variation rate of the film thickness). The film thickness distribution rate (%) can be calculated by using the following equation where $t_{ava}$ designates the average value of the film thickness, $t_{max}$ denotes a maximum value thereof, $t_{min}$ designates a minimum value thereof.

$$\text{The film thickness distribution rate } (\%) = (t_{max} - t_{min}) / t_{ava} \times 100$$

Meanwhile, let G' designate a separation gap at which the resist agent having once contacted the surface 10a is separated therefrom, it is necessary that the coating gap G is less than the separation gap G'. Therefore, it is desirable that the coating gap G is increased as much as possible within a range in which the gap G is less than the separation gap G'. However, in a case where the coating gap G is simply increased, the resist agent 21 having once contacted the surface 10a comes to easily be separated therefrom, that is, the separation of the resist agent 21 from the surface 10a becomes easy to occur.

To increase the coating gap G without separating the resist agent from the surface 10a (that is, without being out of the resist agent 21), the reduction of the friction between the coating nozzle 22 and the resist agent 21, which is caused during the discharge of the resist agent 21 from the coating nozzle 22, is needed. It is necessary for reducing such friction between the coating nozzle 22 and the resist agent 21 to increase the distance (hereunder referred to as the capillary gap distance T) of the capillary gap of the coating nozzle 22, through which the resist agent 21 rises. Also, it is necessary for reducing such friction to decrease the height (hereunder referred to as the liquid level height H) to the top of the coating nozzle 22 from the liquid level of the resist agent 21 at the coating.

Meanwhile, in addition to the coating gap G, the capillary gap distance T, and the liquid level height H, the relative scanning speed V between the coating nozzle 22 and the coated surface 10a of the substrate 10 and the viscosity of the resist agent are cited as parameters for controlling the thickness of the coating film, with which the resist agent is coated.

Figure 1A:
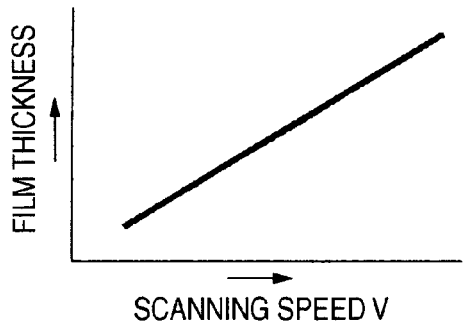
FIGS. 1A to 1E are graphs each illustrating the relation between the thickness of the coating film and an associated one of parameters affecting the thickness of the coating film used in a method of manufacturing a substrate having a resist film according to the invention.
Figure 1B:
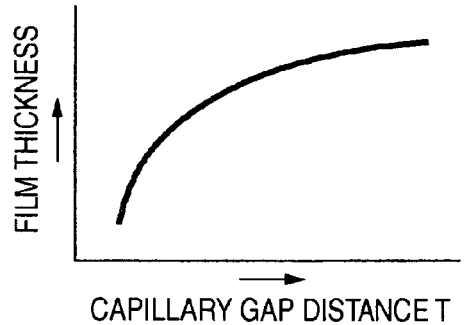

As shown in FIG. 1A described above, the relative speed V between the coating nozzle 22 and the coated surface 10a of the substrate 10 has a relation with the thickness of the coating film 21a so that the higher the speed, the thicker the film thickness. As shown in FIG. 1B, the relation between the capillary gap distance T and the thickness of the coating film is such that the larger the capillary gap distance T, the thicker the film thickness. As shown in FIG. 1D, the relation between the viscosity of the resist agent and the thickness of the coating film is such that the higher the viscosity, the thicker the film thickness. As shown in FIG. 1E, the relation between the liquid level height H and the thickness of the coating film is such that the higher the liquid level height H, the thicker the film thickness.

Figure 1C:
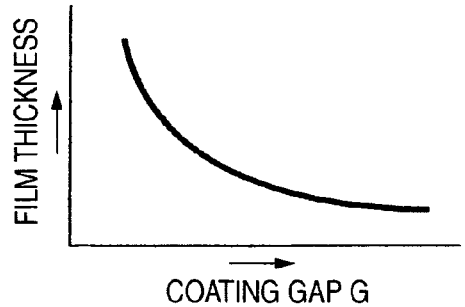
Figure 1D:
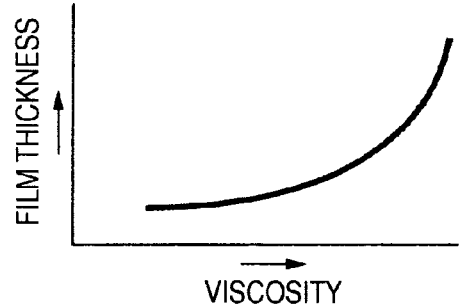
Figure 1E:
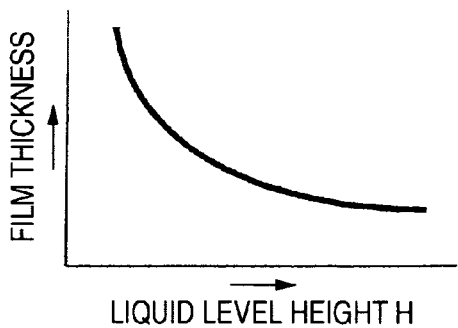

Further, as shown in FIG. 1C, the relation between the coating gap G and the thickness of the coating film is such that the wider the coating gap G, the thicker the film thickness. However, as described above, this coating gap G should be set from the viewpoint of suppressing the film thickness distribution rate thereof, instead of the viewpoint of the film thickness.

The absolute distance of the coating gap G (incidentally, the coating gap G is assumed to be set so that the resist agent is not separated from the coated surface) can be increased by reducing the friction between the resist agent, which rises through the capillary gap, and the coating nozzle. A method of increasing a capillary gap distance T, a method of reducing a liquid level height, and a method of increasing the viscosity of the resist agent are considered as the method of reducing the friction of the resist agent rising through the capillary gap. However, in a case where the viscosity of the resist agent is practically fixed, the method of increasing the capillary gap distance T and the method of reducing the liquid level height H are employed. According to the invention, the capillary gap distance T and the liquid level height H are selected so that the coating gap has a desired large value. Further, according to the invention, the film thickness is controlled according to another parameter, which is the relative scanning speed V between the substrate and the coating nozzle.

The invention enables the increase of the coating gap G by setting the film thickness of the coating film 21a at a predetermined value and also adjusting the capillary gap distance T, the liquid level height H, and the scanning speed V in an adjustable range. Consequently, the film thickness distribution rate can be improved.

According to the invention, the capillary gap distance T and the liquid level height H are set in such a way as to meet the following inequality: (H/T)<45, as shown in TABLE 2 listed below, that is, the liquid level height H is set in such a manner as to be less than 45 times the capillary gap distance T. Thus, the coating gap G can be set at a value at which the film thickness distribution rate has a favorable value. This is because the capillary gap distance T is too small in a case where the liquid level height H is equal to or more than 45 times the capillary gap distance T, so that the friction between the coating nozzle 22 and the resist agent 21 is increased.

TABLE 2

| | | ← Liquid Level Height (H) | | | | | | | | | | (Meniscus Is Easier to Form) → | | |
|---|---|---|---|---|---|---|---|---|---|---|---|---|---|---|
| | | 12000 | 11000 | 10000 | 9000 | 8000 | 7000 | 6000 | 5000 | 4000 | 3000 | 2000 | 1000 | (μm) |
| Meniscus Is Easier to Form | 50 | 240 | 220 | 200 | 180 | 160 | 140 | 120 | 110 | 80 | 60 | 40 | 20 | |
| | 100 | 120 | 110 | 100 | 90 | 80 | 70 | 60 | 50 | 40 | 30 | 20 | 10 | |
| | 150 | 80 | 73.33 | 66.67 | 60 | 53.33 | 46.67 | 40 | 33.33 | 26.67 | 20 | 13.33 | 6.667 | |
| | 200 | 60 | 55 | 50 | 45 | 40 | 35 | 30 | 25 | 20 | 15 | 10 | 5 | |
| | 250 | 48 | 44 | 40 | 36 | 32 | 28 | 24 | 20 | 16 | 12 | 8 | 4 | |
| | 300 | 40 | 36.67 | 33.33 | 30 | 26.67 | 23.33 | 20 | 16.67 | 13.33 | 10 | 6.667 | 3.333 | |
| | 350 | 34.29 | 31.43 | 28.57 | 25.71 | 22.86 | 20 | 17.14 | 14.29 | 11.43 | 8.571 | 5.714 | 2.857 | |
| | 400 | 30 | 27.5 | 25 | 22.5 | 20 | 17.5 | 15 | 12.5 | 10 | 7.5 | 5 | 2.5 | |
| | 450 | 26.67 | 24.44 | 22.22 | 20 | 17.78 | 15.56 | 13.33 | 11.11 | 8.889 | 6.667 | 4.444 | 2.222 | |
| Capillary gap distance (T) | 500 | 24 | 22 | 20 | 18 | 16 | 14 | 12 | 10 | 8 | 6 | 4 | 2 | |
| | 550 | 21.82 | 20 | 18.18 | 16.36 | 14.55 | 12.73 | 10.91 | 9.091 | 7.273 | 5.455 | 3.636 | 1.818 | |
| | 600 | 20 | 18.33 | 16.67 | 15 | 13.33 | 11.67 | 10 | 8.333 | 6.667 | 5 | 3.333 | 1.667 | |
| | 650 | 18.46 | 16.92 | 15.38 | 13.85 | 12.31 | 10.77 | 9.231 | 7.692 | 6.154 | 4.615 | 3.077 | 1.538 | |
| | 700 | 17.14 | 15.71 | 14.29 | 12.86 | 11.43 | 10 | 8.571 | 7.143 | 5.714 | 4.286 | 2.857 | 1.429 | |
| | 800 | 15 | 13.75 | 12.5 | 11.25 | 10 | 8.75 | 7.5 | 6.25 | 5 | 3.75 | 2.5 | 1.25 | |

Top row represents values of the liquid level height (H).
Leftmost column represents values of the capillary gap distance (T).
Inside cells of this table represent values of (H/T)

Figure 4:
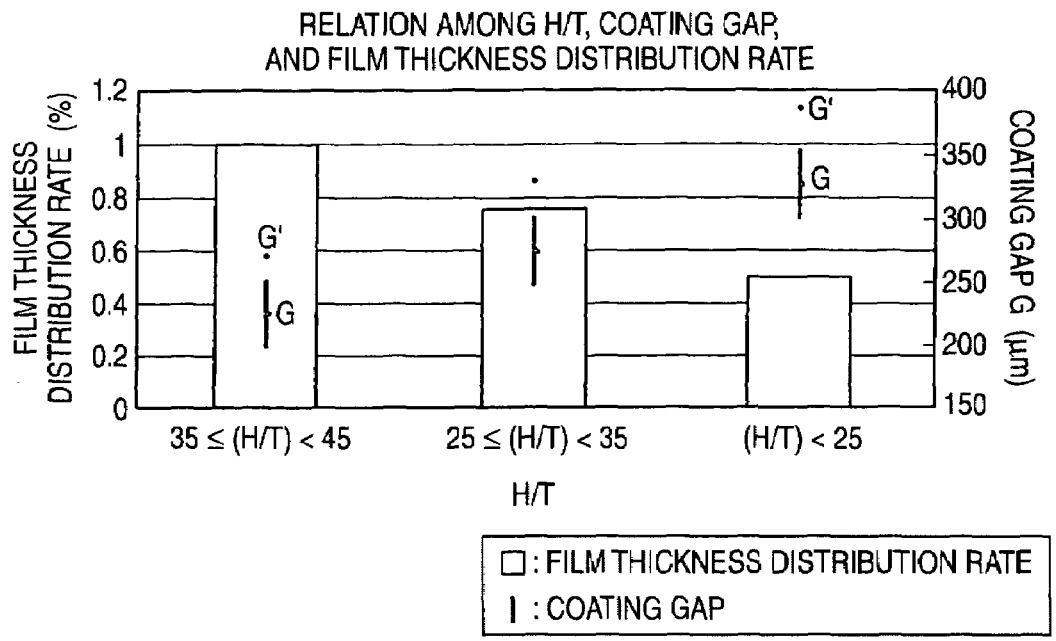
FIG. 4 is a graph illustrating the relations between the ratio of the liquid level height to the capillary gap distance and between the coating gap and the film thickness distribution rate used in the method of manufacturing a substrate having a resist film according to the invention.

FIG. 4 is a graph illustrating the relations between the ratio of the liquid level height H to the capillary gap distance T and between the coating gap G and the film thickness distribution rate.

As is seen from TABLE 2 and FIG. 4, in a case where the value of (H/T) is equal to or more than 35 and less than 45, the coating gap G can be set in such a way as to range from 200 μm to 250 μm. In this case, the film thickness distribution rate of the coating film 21a in the region, whose area is at least 70% of that of the substrate, can be set to be equal to or less than 1%, as illustrated in FIGS. 2 and 4. In a case where (H/T) is equal to or more than 25 and less than 35, the coating gap G can be set to range from 250 μm to 300 μm. In this case, the film thickness distribution rate of the coating film 21a in the region, whose area is at least 70% of that of the substrate, can be set to be equal to or less than 0.75%, as illustrated in FIGS. 2 and 4. In a case where (H/T) is less than 25, the coating gap G can be set to range from 300 μm to 350 μm. In this case, the film thickness distribution rate of the coating film 21a in the region, whose area is at least 70% of that of the substrate, can be set to be equal to or less than 0.5%, as illustrated in FIGS. 2 and 4. For example, in a case where a high-precision large-sized mask, such as a graytone mask having a fine pattern, is manufactured, it is preferable that the film thickness distribution rate of the coating film 21a is equal to or less than 0.5%. Incidentally, practically, it is preferable that (H/T) is equal to or more than 1. From a practical viewpoint, an optimal range of (H/T) is give by the following inequality: 10<(H/T)<25.

In a case where the liquid level height H is low, the friction between the coating nozzle 22 and the resist agent 21 is reduced, as compared with an inverse case. Also, a meniscus of the resist agent 21 to be formed at the top portion of the coating nozzle 22 becomes easy to form. However, in a case where the liquid level height H is too small, the liquid tank 20 and the substrate 10 are too much close to each other. Thus, it is difficult to safely coat the surface of the substrate. Further, in a case where the liquid level height H is extremely small, a capillary phenomenon does not occur in the coating nozzle 22. Conversely, in a case where the liquid level height H is too large, the friction between the coating nozzle 22 and the resist agent 21 becomes high. Moreover, this causes the problem that the reproducibility of the meniscus of the resist agent 21 formed at the top portion of the coating nozzle 22 becomes unstable. A range, in which such a disadvantage does not occur, is the adjustable range of the liquid level height H. In view of these respects, preferably, the liquid level height H is selected from a range from 1 mm to 12 mm. More preferably, the liquid level height H is selected from a range from 5 mm to 11 mm.

In a case where the capillary gap distance T is large, the friction between the coating nozzle 22 and the resist agent 21 is reduced, as compared with an inverse case. However, in a case where the capillary gap distance T is too large, there is the possibility that a capillary phenomenon itself does not occur in the capillary gap 23. Further, a meniscus of the resist agent 21 to be formed at the top portion of the coating nozzle 22 becomes difficult to form. Conversely, in a case where the capillary gap distance T is too small, the friction between the coating nozzle 22 and the resist agent 21 becomes high. A range, in which such a disadvantage does not occur, is the adjustable range of the capillary gap distance T. In view of these respects, preferably, the capillary gap distance T is selected from a range from 50 μm to 800 μm. More preferably, the capillary gap distance T is selected from a range from 200 μm to 600 μm.

The thickness of the coating film 21a made of the resist agent 21 can be set in such a way as to range 200 nm to 2000 nm. It is preferable for obtaining such a film thickness that the relative scanning speed V is set in such a manner as to range from 0.5 m/min. to 0.1 m/min.

Further, preferably, the viscosity of the resist agent 21 is set in such a way as to range from 3 cp to 20 cp.

As described above, in a case where the coating gap G is large, a favorable film thickness distribution rate of the coating film 21a can be obtained, as compared with an inverse case. In a case where the coating gap G is increased, the resist agent 21 having once contacted to the coated surface 10a is separated therefrom when this coating gap G reaches the separation gap G'. Thus, the coating gap G should be set to be less than the separation gap G'. According to the invention, preferably, the coating gap G is increased as much as possible in a range in which the coating gap G is less than the separation gap G'. That is, it is preferable that the coating gap G is at least 50% of and less than the separation gap G'. Therefore, a range in which the coating gap G is less than the separation gap G', is an adjustable range for each of the liquid level height H, the capillary gap distance T, and the scanning speed V.

More preferably, the coating gap G is set in such a way as to range from 70% to 95% of the separation gap G'. The film thickness distribution rate can be suppressed extremely favorably by setting the coating gap G in such a manner as to be equal to or more than 70% of the separation gap G'. Incidentally, in a case where the coating gap G becomes equal to or more than 95% of the separation gap G', the resist agent may be separated from the surface, which is to be coated, in a fragmentary manner under various conditions relating to, for example, the size of the substrate, during the coating. That is, there is the possibility of occurrence of the separation of the resist agent from the surface to be coated. From the viewpoint of surely preventing such separation of the resist agent, it is preferable that the coating gap G is equal to or less than 90% of the separation gap G'.

It is preferable for obtaining the film thickness distribution rate, which is equal to or less than, for instance, 1% of the average film thickness, that the coating gap G is equal to or more than 200 μm. Further, it is preferable for obtaining the more favorable film thickness distribution rate, which is equal to or less than, for instance, 0.75% of the average film thickness, that the coating gap G is equal to or more than 250 μm. Furthermore, it is preferable for obtaining the more favorable film thickness distribution rate, which is equal to or less than, for example, 0.5% of the average film thickness, that the coating gap G is equal to or more than 300 μm.

Hereinafter, an embodiment of the invention is described in detail.

Configuration of Coating Apparatus

Upon describing the embodiment of the invention, first, the configuration of a coating apparatus having a mechanism for holding the substrate 10 having the surface 10a and for moving the substrate 10 with respect to the coating nozzle 22 is described hereinbelow by referring to FIGS. 5 to 8. In this coating apparatus, the resist agent 21 is applied to the substrate 10 by performing the method of manufacturing a substrate having a resist film according to the invention.

Figure 5:
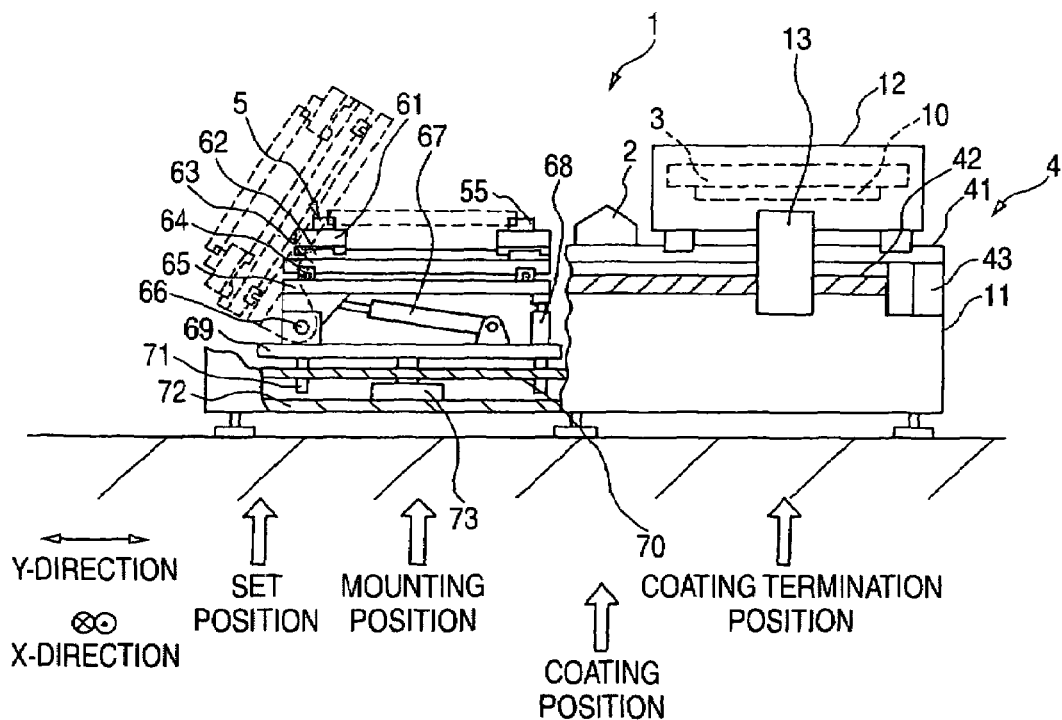
FIG. 5 is a side view illustrating the configuration of the coating unit of the coating apparatus.

FIG. 5 is a side view illustrating the configuration of the coating apparatus.

As illustrated in FIG. 5, this coating apparatus comprises a base frame 11, a coating unit 2 installed in this base frame 11, a moving frame 12 movably supported on the base frame 11 and horizontally moved by a moving unit 4, a sucking unit 3 provided on this moving frame 12 for sucking the substrate 10, and a holding unit 5 for detachably holding the substrate 10. The coating unit 2, the sucking unit 3, the moving unit 4, and the holding unit 5 operate by being controlled by a control portion (not shown).

In this embodiment, the substrate 10 is a photomask blank, which has a size of 390 mm×490 mm and is obtained by forming a light shielding pattern on a transparent substrate. The resist agent applied to the substrate 10 by the coating unit 2 is used for forming a resist film so as to form a light shielding film pattern on the substrate 10 and as to form this substrate 10 as a photomask.

Figure 6:
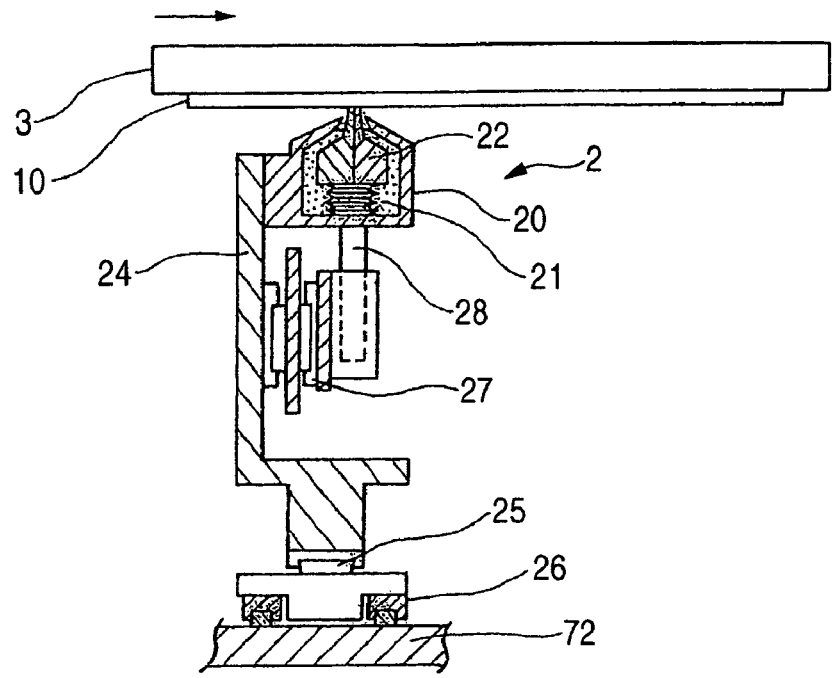
FIG. 6 is a cross-sectional view illustrating the configuration of the coating unit of the coating apparatus.

FIG. 6 is a cross-sectional view illustrating the configuration of the coating unit 2 of this coating apparatus.

As shown in FIG. 6, the coating unit 2 is configured so that the liquid resist agent 21 stored in the liquid tank 20 is raised by utilizing a capillary phenomenon caused in the capillary gap 23 of the coating nozzle 22, that the top portion of the coating nozzle 22 is caused to move closer to the surface 10a of the substrate 10, which is to be coated and downwardly directed, and that the resist agent 21 raised by the coating nozzle 22 is caused to wet the surface 10a through the top portion of the coating nozzle 22.

That is, this coating unit 2 has the liquid tank 20 for reserving the liquid resist agent 21. This liquid tank 20 is configured in such a way as to have a length corresponding to the length of a side in a lateral direction of the substrate 10, that is, in a direction perpendicular to a longitudinal direction (that is, a direction perpendicular to paper on which FIG. 6 is drawn), in which the substrate 10 is moved by the moving frame 12 as will be described later, of the substrate 10. This liquid tank 20 is upwardly and downwardly movably mounted and supported on the top side of a support plate 24. Further, this liquid tank 20 is moved by a drive mechanism (not shown) upwardly and downwardly with respect to the support plate 24. This drive mechanism is operated by being controlled by the control portion.

Furthermore, the support plate 24 is supported at the bottom thereof on a bottom frame 72 of the base frame 11 through linear ways 25 and 26 disposed in such a manner as to be orthogonal to each other. That is, the position of this support plate 24 can be adjusted on the bottom frame 72 in two orthogonal directions. The support plate 24 is provided with a support tube 28 that supports the coating nozzle 22 accommodated in the liquid tank 20 through a slide mechanism 27.

Figure 7:
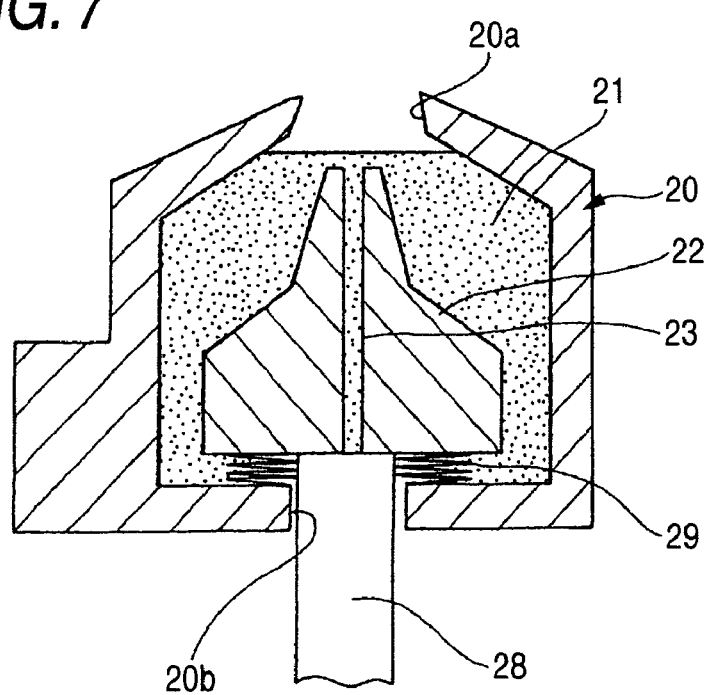
FIG. 7 is a cross-sectional view illustrating the configuration of a primary part of the coating unit of the coating apparatus.

FIG. 7 is a cross-sectional view illustrating the configuration of a primary part of the coating unit 2 of this coating apparatus.

As shown in FIG. 7, the support tube 28 is configured so that the top side thereof enters this liquid tank 20 through a through hole 20b provided in the bottom portion of the liquid tank 20. The coating nozzle 22 is attached to the top portion of this support tube 28. This coating nozzle 22 is supported by the support tube 28 and accommodated in the liquid tank 20. This coating nozzle 22 is configured in such a way as to have a length corresponding to the length in a lateral direction (that is, a direction perpendicular to the paper on which FIG. 7 is drawn) of the substrate 10. The coating nozzle 22 has a slit-like capillary gap 23 provided along the longitudinal direction thereof. This coating nozzle 22 is configured in such a way as to have the width of the top side thereof, which is narrowed across the capillary gap 23, and as to have a beak-shaped cross-section. The top portion of the capillary gap 23 is opened like a slit in the top portion of the coating nozzle 22 over substantially the entire length of this coating nozzle 22. Further, this capillary gap 23 is opened in the downward direction of the coating nozzle 22.

The slide mechanism 27 moves the support tube 28 upwardly and downwardly with respect to the support plate 24 under the control of the control portion by using the drive mechanism (not shown). That is, the liquid tank 20 and the coating nozzle 22 are moved with respect to the support plate 24 independent of each other.

A through hole portion 20a for upwardly projecting the top side of the coating nozzle 22 toward the top side of the liquid tank 20 is provided in the top surface portion of this liquid tank 20. Incidentally, a part surrounding the through hole 20b provided in the bottom portion of the liquid tank 20 is connected to the bottom portion of the coating nozzle 22 through bellows 29 to thereby prevent the resist agent 21 from leaking out of this through hole 20b.

Then, as shown in FIG. 5, the moving frame 12 is a mechanism for sucking and holding the substrate 10 through the sucking unit 3 and for horizontally moving the substrate 10 with respect to the coating unit 2. This moving frame 12 is constituted by integrally connecting a pair of opposed side plates and a top plate, which connects the pair of opposed side plates, with one another in such a way as to have sufficient mechanical strength so as to prevent the positional accuracy of each of the substrate 10 and the coating unit 2 from being deteriorated due to insufficient rigidity.

This moving frame 12 is supported by the base frame 11 through a linear way 41 placed on the base frame 11, and enabled to horizontally move on this base frame 11. Further, a moving member 13 is attached to one of the side plates of this moving frame 12. A nut portion is formed in this moving member 13. A ball screw 42 constituting the moving unit 4 attached to the base frame 11 is screwed into the nut portion of this moving member 13.

Also, the sucking unit 3, which has a sucking plate provided with plural sucking holes (not shown), for sucking the substrate 10 is mounted in substantially the central portion of the top plate of this moving frame 12.

The moving unit 4 comprises the ball screw 42, which is screwed into the nut portion of the moving member 13, and a motor 43 for rotating the ball screw 42.

In this moving unit 4, the motor 43 is driven under the control of the control portion and screws the ball screw 42. The moving member 13 is horizontally moved together with the moving frame 12 by a predetermined distance in a predetermined direction by a predetermined number of revolutions in a predetermined direction of the ball screw 42 under the control of the control portion.

Incidentally, the vertical position (or height) precision of each of the sucking unit 3 and the coating unit 2 is determined by an error in the distance (or difference in height) between the linear way 41 and the sucking unit 3, an error in the distance (or difference in height) between the linear way 41 and the coating unit 2, and an error due to the shape of the linear way 41 itself.

The holding unit 5 is a mechanism for first holding the substrate 10, which is carried thereto from the outside of this coating apparatus, in a substantially vertically inclined position and for subsequently putting the substrate 10 in a horizontal position and transferring such a substrate 10 to the sucking unit 3 attached to the moving frame 12. This holding unit 5 also serves as a mechanism for receiving the substrate 10, on which the application of the resist agent is completed by the coating unit 2, from the sucking unit 3 and for putting the received substrate 10 into a horizontal position and subsequently putting this substrate 10 into a substantially vertically inclined position to thereby enable the conveyance of this substrate 10 to the outside of this coating apparatus.

Figure 8:
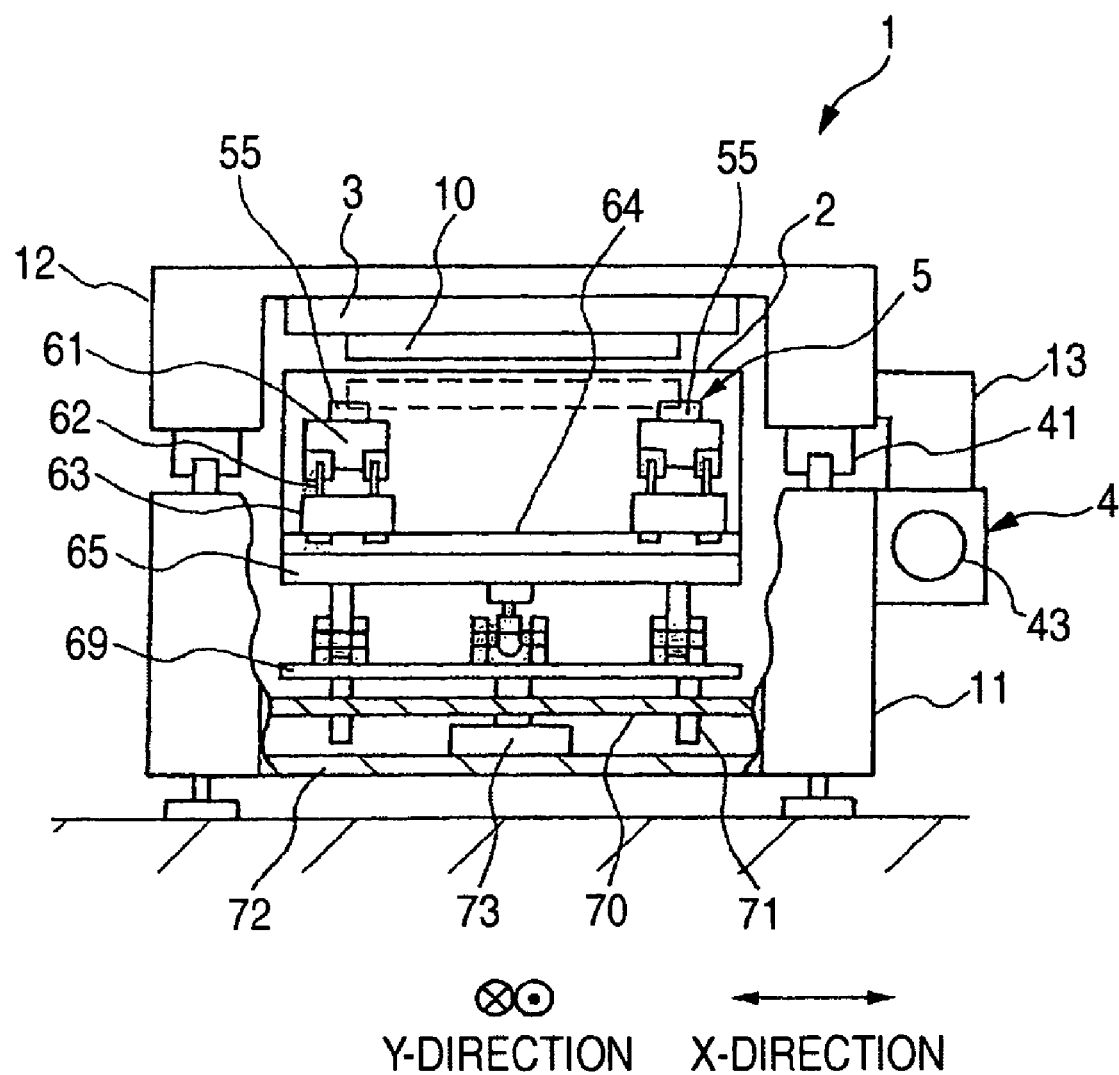
FIG. 8 is a front view illustrating the configuration of the coating unit of the coating apparatus.

FIG. 8 is a front view illustrating the configuration of the coating unit of the coating apparatus.

As shown in FIGS. 5 and 8, this holding unit 5 is configured in such a way as to have a base plate 69 and a turning plate 65 turnably supported on this base plate 69 between the horizontal position and the substantially vertically inclined position.

Also, this holding unit 5 has four holding members 55 each fixed to the holding plate 61 provided on the turning plate 65 through the linear way 64, a pair of rails 63 and the linear way 62. These holding members 55 hold the peripheral edge portions provided at the four corners of the substrate 10.

A pressing unit (not shown) is provided in the vicinity of each of the holding members 55 in such a way as to prevent the substrate 10, which is set on the holding members 55, from being detached therefrom. This pressing unit is constituted by, for example, a pressing plate enabled to move upwardly and downwardly and to turn in a horizontal direction. This pressing unit press the substrate 10, which is set on the holding unit 55, against the holding members 55.

A set of two holding plates 61 is provided on a pair of rails 63 placed in a direction in parallel with the linear way 41 of the base frame 11, which is indicated by arrows Y shown in FIG. 5, through the linear way 62. The two holding plates 61, which are provided at the side near to the coating unit 2, can be moved by a drive unit (not shown), which has a ball screw and a motor, in the direction of the arrows Y shown in FIG. 5. Consequently, even in a case where the longitudinal dimensions of the substrates 10 differ from one another, the holding members 55 can be respectively opposed to the peripheral edge portions provided at the four corners of the substrate 10 by moving the two holding plates 61 in the Y-direction through the use of this drive unit.

Further, paired rails 63 are mounted on the turning plate 65 at both end portions thereof through the linear way 64 arranged in a direction perpendicular to the linear way 41 on the base frame 11, which is indicated by an arrow X shown in FIG. 5. These rails 63 can be moved in the direction of the arrow X shown in FIG. 5 by the drive unit (not shown), which has the ball screw and the motor. Consequently, even in a case where the transversal dimensions of the substrates 10 differ from one another, the holding members 55 can be respectively opposed to the peripheral edge portions provided at the four corners of the substrate 10 by moving the two holding plates 61 in the X-direction through the use of this drive unit.

The turning plate 65 is supported so that an end portion thereof, which is provided at the far side from the coating unit 2, can be turned by a turning shaft 66 with respect to the base plate 69. This turning plate 65 is adapted so that when put into a horizontal position, the end portion thereof, which is provided at the near side to the coating unit 2, is supported by a stopper 68, which is provided in such a way as to project from the base plate 69.

Subsequently, this turning plate 65 is turned around the turning shaft 66 by a turning cylinder 67 attached to the base plate 69 at one end thereof. That is, this turning cylinder 67 is connected to the turning plate 65 at the other end thereof and can be elongated and contracted.

Further, guide rods 71 are provided at the four corners of the bottom surface of the base plate 69 in such a way as to project therefrom. These guide rods 71 penetrate through holding-unit frame 70 fixed to the base frame 11. These guide rods 71 are guided by the holding-unit frame 70. Thus, the base plate 69 can move upwardly and downwardly with respect to the holding-unit frame 70 by simultaneously maintaining the horizontal state. Further, the base plate 69 can be moved upwardly and downwardly in a vertical direction by a lifting unit 73, such as an air cylinder, provided on the bottom frame 72 of the base frame 11.

Operation of Coating Apparatus

Next, an operation of this coating apparatus 1 is described hereinbelow by referring to FIGS. 5 and 9.

Figure 9:
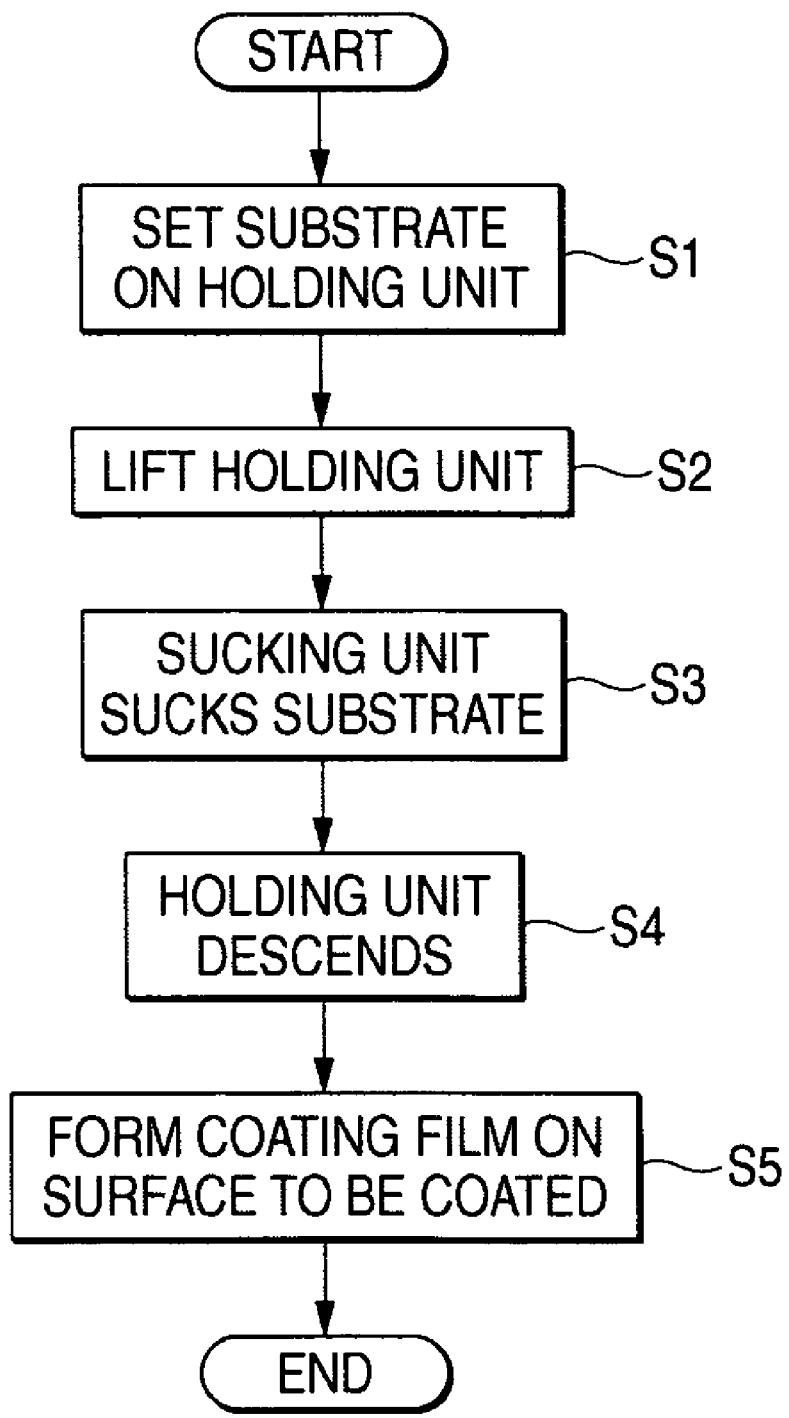
FIG. 9 is a flowchart illustrating a first procedure in the manufacturing method according to the invention.

FIG. 9 is a flowchart illustrating a first procedure in the manufacturing method according to the invention.

First, this coating apparatus is set in an initial state. As shown in FIG. 5, the base plate 69 is not lifted by the lifting unit 73 in this initial state. The turning plate 65 is supported in a horizontal state. The moving frame 12 is placed at the coating termination position. The liquid tank 2 and the coating nozzle 22 of the coating unit 2 are not lifted.

Incidentally, the positions of the four holding members 55 are preliminarily adjusted according to the longitudinal dimension and the transverse dimension of the substrate 10. Incidentally, the substrate 10 is a rectangle substrate, one of the sides of which is equal to or more than 300 mm. This adjustment is performed as follows. That is, the positioning of the holding members 55 according to the transverse dimension of the substrate 10 is performed by moving the rails 63 in the X-direction. Also, the positioning of the holding members 55 according to the longitudinal dimension of the substrate 10 is performed by moving the holding plate 61 in the Y-direction.

Subsequently, in this coating apparatus 1, the turning plate 65 is turned by the turning cylinder 67 to the set position in such a way as to turn out in a direction in which the turning plate 65 gets away from the coating unit 2.

Then, in step S1 shown in FIG. 9, a worker operating at the front side of the coating apparatus 1 sets the substrate 10 on the holding members 5 in a state in which the surface 10a of the substrate 10, which is to be coated, is directed to the side of the coating apparatus 1. At that time, the pressing unit press the four corner portions of the substrate 10 against the holding members 55. Consequently, the substrate 10 set on the obliquely inclined holding members 55 neither slips off therefrom and nor drops.

Subsequently, the tuning plate 65 is turned by the turning cylinder 67 in a direction, in which the turning plate 65 gets closer to the coating unit 2, until the turning plate 65 is supported by the stopper 68 and put into a horizontal state.

Then, when the tuning plate 65 is put into a horizontal position, so that the substrate 10 is horizontally supported, the pressing unit cancels a pressure from the substrate 10. Incidentally, the pressing unit having released the pressure is brought into a position that is lower than the top surface of the substrate 10 and does not abut against the sucking unit 3 that sucks the substrate 10.

Subsequently, in step S2 shown in FIG. 9, the moving frame 12 is moved by the moving unit 4 to a mounting position in which the sucking position of the sucking unit 3 is located on the substrate 10. At that time, the liquid tank 20 and the coating nozzle 22 of the coating unit 2 are still in a descent state.

Subsequently, the lifting unit 73 elevates the base plate 69 until the top surface of the substrate 10 abuts against the sucking unit 3. Incidentally, at that time, the lifting unit 73 may be controlled to stop the rise of the base plate 69 before the top surface of the substrate 10 abuts against the sucking unit 3, so that a slight gap remains between the top surface of the substrate 10 and the sucking unit 3.

Then, in step S3 shown in FIG. 9, the sucking unit 3 sucks the substrate 10 through sucking holes. When the substrate 10 is sucked by the sucking unit 3, the lifting unit 73 lowers the base plate 69 in step S4 shown in FIG. 9.

Subsequently, in step S5 shown in FIG. 9, the resist agent 21 is applied to the surface 10a of the substrate 10, which is downwardly directed, by the coating unit 2. Although an operation of coating the resist agent 21 by the coating unit 2 is described later, an outline thereof is given hereinbelow. That is, the moving frame 12 is moved to the coating position, which is a position located on the coating unit 2. Also, the liquid tank 20 and the coating nozzle 22 of the coating unit 2 are raised to predetermined positions. Then, the resist agent 21 lifted to the top portion of the coating nozzle 22 by utilizing the capillary phenomenon contacts the surface 10a to be coated. Subsequently, the height of the coating nozzle 22 is adjusted to a predetermined value. Then, the moving frame 12 passes through the coating position during a state in which the clearance between the top portion of the coating nozzle 22 and the surface 10a of the substrate 10 is maintained at a constant value. Thus, the coating film 21a, whose thickness is uniform, is formed on the surface 10a of the substrate 10.

Then, when the moving frame 12 is moved to the coating termination position, the coating unit 2 is lowered. Subsequently, the moving frame 12 is returned by being horizontally moved to the mounting position.

Then, the lifting unit 73 lifts the base plate 69 until the holding members 55 abut against the substrate 10. When the holding members 55 abut against the substrate 10, the sucking unit 3 stops suction and releases the substrate 10 therefrom by air-blowing. At that time, the substrate 10 is put on the holding members 55.

Incidentally, in a case where the holding members 55 are made of an insulating material, and where electric charges are stored in the substrate 10, when the substrate 10 is put on the holding members 55, there is the possibility of occurrence of electrostatic discharge at a place at which the substrate 10 abuts against the holding member 55. It is preferable for preventing occurrence of such electrostatic discharge that the holding members 55 are formed of an electrically conductive material, such as metal.

Subsequently, the lifting unit 73 lowers the base plate 69 and stops this base plate at a predetermined position. Then, the pressing unit presses the substrate 10 against each of the holding members 55 and fixes the substrate 10 thereagainst. Subsequently, the turning plate 65 is turned by the turning cylinder 67 in a direction, in which the turning plate 65 goes away from the coating unit 2, into a substantially vertically inclined position.

When the turn of the turning plate 65 is stopped, the pressing of the substrate 10 by the pressing unit is canceled. In this state, the worker can easily remove the substrate 10, on which the coating film 21a is formed, from the holding members 55.

Thus, in the coating apparatus 1 according to this embodiment, the resists agent 21 is applied to the surface 10a of the substrate 10, which is downwardly directed, from below. Then, the moving unit 4 does not have a mechanism, such as a reverse unit, which may increase an error in a vertical direction. Therefore, this coating apparatus 1 can enhance the vertical position precision of each of the substrate 10 and the coating nozzle 22 of the coating unit 2 to thereby form the coating film 21a, which has a uniform thickness, on the substrate 10.

Further, when the substrate 10 is attached to and detached from this coating apparatus 1, the turning plate 65 of the holding unit 5 is turned and put into the substantially vertically inclined position. Therefore, a worker can easily attach the substrate 10 to and detach the substrate 10 from each of the holding members 55 in this coating apparatus 1.

Furthermore, in this coating apparatus 1, each of the holding members 55 of the holding unit 5 can be moved in each of the directions indicated by the arrows X and Y shown in FIG. 5. Thus, the position of each of the holding members 55 can quickly and easily be changed according to the size of the substrate 10. Consequently, the productivity of substrates produced by changing the type thereof can be enhanced.

Method of Manufacturing Substrate Having Resist Film

Next, a method of manufacturing a substrate having a resist film in the coating apparatus 1 is described hereinbelow by referring to FIGS. 7 and 10.

Figure 10:
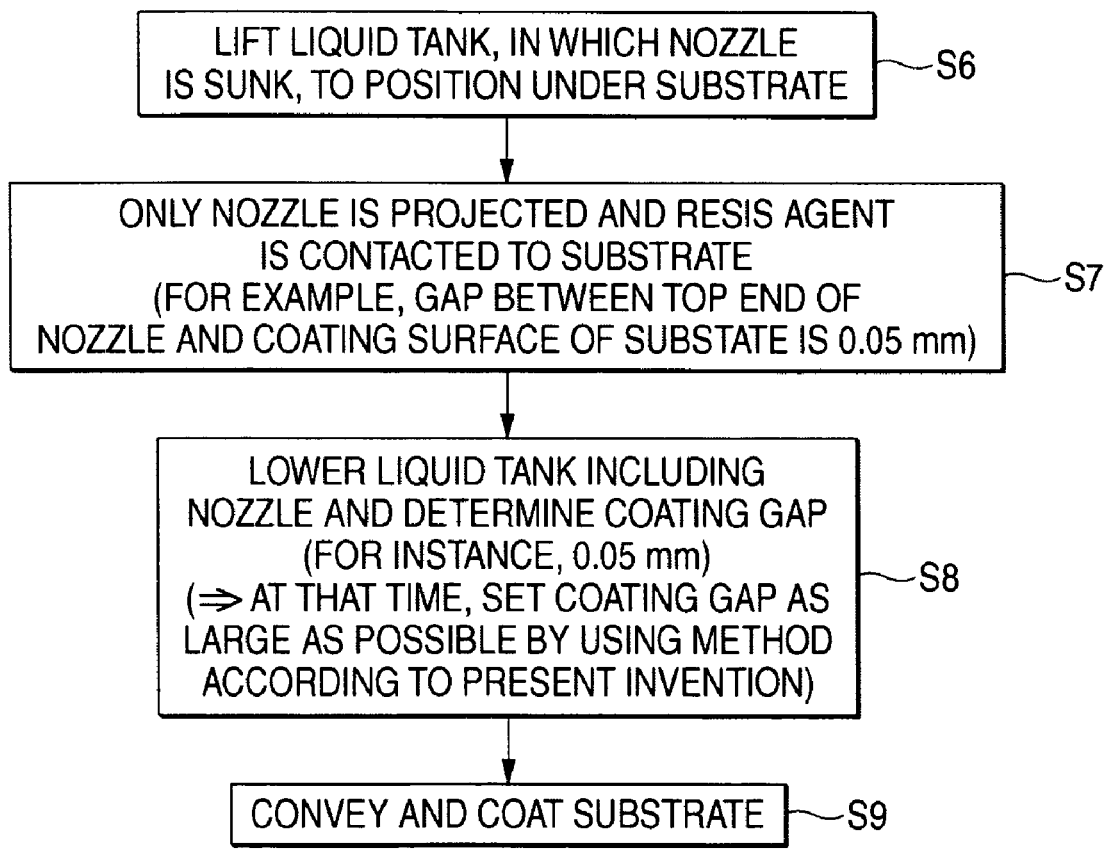
FIG. 10 is a flowchart illustrating a second procedure in the manufacturing method according to the invention.

FIG. 10 is a flowchart illustrating a second procedure in the method of manufacturing a substrate having a resist film according to the invention.

In step S5 shown in FIG. 9, the resist agent 21 is applied to the substrate 10 by the following procedure.

First, the moving frame 12 is stopped at a place associated with a coating start position for starting the application of the resist agent 21 onto the substrate 10, which is determined so that the coating start position is located above the top portion of the coating nozzle 22 of the coating unit 2. The coating start position for starting the application of the resist agent 21 onto the substrate 10 is located at a side edge portion of this substrate 10.

In step S6 shown in FIG. 10, during this state, the control portion lifts cause both the liquid tank 20, in which the resist agent 21 is stored so that the top surface thereof reaches a predetermined liquid level, and the coating nozzle 22, which is completely sunk in this resist agent 21, to rise and get close to the surface 10a of the substrate 10 from below.

Subsequently, in step S7 shown in FIG. 10, the control portion stops the rise of the liquid tank 20 and causes the top side of the coating nozzle 22 to project upwardly from the top surface of the resist agent 21 stored in this liquid tank 20, as shown in FIG. 2. At that time, the coating nozzle 22 being completely sunk in the resist agent 21 is upwardly projected from the top surface of this resist agent 21. Thus, the coating nozzle 22 is in a state in which the capillary gap 23 is filled with the resist agent 21. Further, the control portion lifts the coating nozzle 22 and causes the resist agent 21 provided at the top portion of this coating nozzle 22 to wet the surface 10a of the substrate 10. Then, the control portion causes the coating nozzle 22 to stop rising.

At that time, the coating gap G designated by an arrow G shown in FIG. 2 is set at, for example, about 50 μm.

Then, in step S8 shown in FIG. 10, in a state in which the resist agent 21 provided at the top portion of the coating nozzle 22 wets the surface 10a of the substrate 10, the control portion causes the liquid tank 20 and the coating nozzle 22 to descend to a "coating height" position. Thus, the coating gap G has a predetermined distance of, for example, about 300 μm.

In step S9 shown in FIG. 10, in this state, the control portion causes the moving frame 12 to move thereby to move the substrate 10 in a surface direction. Then, the control portion causes the top portion of the coating nozzle 22 to scan the entire surface 10a, as shown in FIG. 2. Thus, the coating film 21a made of the resist agent 21 is formed over the entire surface 10a.

According to this manufacturing method, as described above, the parameter affecting the thickness of the coating film 21a, which is other than the coating gap G, is set so that the coating gap G becomes large as much as possible, and that the thickness of the coating film 21a has the predetermined value.

That is, the control portion controls the relative scanning speed V between the substrate 10 and the coating nozzle 22 and the liquid level height H according to the capillary gap distance T of the coating nozzle 22 and the viscosity of the resist agent 21, which are preliminarily set, so that the thickness of the coating film 21a has the predetermined value, and that the coating gap G is equal to or larger than, for example, 300 μm.

Although the method of manufacturing a substrate having a resist film according to the invention is described by showing the preferred embodiment, the method of manufacturing a substrate having a resist film according to the invention is not limited thereto. Needless to say, various modifications may be made within the true spirit and scope of the invention.

According to the first aspect of the invention, in the resist agent coating step, a thickness of the coating film, which is made of the resist agent to be applied to the surface, is set at a predetermined value. Simultaneously, a height from a liquid level of the resist agent in the liquid tank to a top end of the coating nozzle is reduced in an adjustable range, and/or a distance of a capillary gap, in which a capillary phenomenon is caused, in the coating nozzle is increased within an adjustable range. Thus, the resist agent is applied by using the coating gap, which is adjusted to a large value within an adjustable range. Consequently, the coating gap, that is, the distance between the top portion of the coating nozzle and the surface to be coated can be widen. The film thickness distribution rate of the coating film can be reduced. The uniformity of thickness of the resist film can be enhanced.

Further, according to the second aspect of the invention, the height from the liquid level of the resist agent in the liquid tank to the top end of the coating nozzle is set to be equal to or more than the distance of the capillary gap, in which a capillary phenomenon is caused, in the coating nozzle and to be less than 45 times the distance of the capillary gap. Thus, the coating gap can be set at a value enabled to obtain a favorable value as the value of film thickness distribution rate.

Furthermore, according to the third aspect of the invention, the thickness of the coating film made of the resist agent, which is applied to the surface to be coated, is set to a value selected from a range from 200 nm to 2000 nm. The coating gap is set to be equal to or more than 200 µm. Thus, the film thickness distribution rate of the coating film is equal to or less than 1% in a region, the area of which is at least 70% of that of a large rectangle substrate, one of sides of which has a length of 300 nm or more. Consequently, the uniformity of thickness of the resist film can be enhanced.

Further, according to the fourth aspect of the invention, the thickness of the coating film made of the resist agent, which is applied to the surface to be coated, is set to a value selected from a range from 200 nm to 2000 nm. The coating gap is set to be equal to or more than 250 µm. Thus, the film thickness distribution rate of the coating film is equal to or less than 0.75% in a region, the area of which is at least 70% of that of a large rectangle substrate, one of sides of which has a length of 300 nm or more. Consequently, the uniformity of thickness of the resist film can be enhanced.

Furthermore, according to the fifth aspect of the invention, the thickness of the coating film made of the resist agent, which is applied to the surface to be coated, is set to a value selected from a range from 200 nm to 2000 nm. The coating gap is set to be equal to or more than 300 µm. Thus, the variation rate of the thickness of the coating film is equal to or less than 0.5% in a region, the area of which is at least 70% of that of a large rectangle substrate, one of sides of which has a length of 300 nm or more. Consequently, the uniformity of thickness of the resist film can be enhanced.

Further, according to the sixth aspect of the invention, the substrate is a photomask blank that is a material of a photomask obtained by forming a light shielding pattern on a transparent substrate. Thus, a photomask blank, in which the uniformity of thickness of the resist film is enhanced, can be manufactured.

What is claimed is:

1. A method of manufacturing a substrate having a resist film on a surface thereof comprising:
    resist agent coating steps of:
    raising liquid resist agent stored in a liquid tank by a capillary phenomenon to a top portion of a coating nozzle,
    orienting a surface of the substrate to be coated in a downward-facing direction, and with a separation from the top portion of the coating nozzle sufficient to having a predetermined coating gap formed between the surface and a top portion of the coating nozzle, and
    performing a relative scan between the coating nozzle and the surface while the resist agent raised by the coating nozzle is in contact with the surface, thereby forming a coating film,
    wherein the substrate is a rectangle substrate, one of sides of which has a length that is equal to or more than 300 mm; and a thickness of the coating film is set at a value selected from a range from 200 nm to 2000 nm, and the coating gap is set to be equal to or more than 200 µm, so that a film thickness distribution rate of the coating film in a region, of which area is at least 70% of area of the substrate, is equal to or less than 1%.

2. The method of manufacturing a substrate having a resist film according to claim 1, wherein the substrate is a photomask blank that is a material of a photomask obtained by forming a light shielding pattern on a transparent substrate.

3. The method of manufacturing a substrate having a resist film according to claim 1, wherein the height from the liquid level of the resist agent in the liquid tank to the top end of the coating nozzle is set to be equal to or more than a distance of a capillary gap, and to be less than 45 times the distance of the capillary gap, said distance of a capillary gap being a distance of a gap in the coating nozzle in which capillary phenomenon occurs.

4. A method of manufacturing a substrate having a resist film on a surface thereof comprising:
    resist agent coating steps of:
    raising liquid resist agent stored in a liquid tank by a capillary phenomenon to a top portion of a coating nozzle,
    orienting a surface of the substrate to be coated in a downward-facing direction, and with a separation from the top portion of the coating nozzle sufficient to having a predetermined coating gap formed between the surface and a top portion of the coating nozzle, and
    performing a relative scan between the coating nozzle and the surface while the resist agent raised by the coating nozzle is in contact with the surface, thereby forming a coating film,
    wherein the substrate is a rectangle substrate, one of sides of which has a length that is equal to or more than 300 mm; and a thickness of the coating film is set at a value selected from a range from 200 nm to 2000 nm, and the coating gap is set to be equal to or more than 250 µm, so that a film thickness distribution rate of the coating film in a region, of which area is at least 70% of area of the substrate, is equal to or less than 0.75%.

5. The method of manufacturing a substrate having a resist film according to claim 4, wherein the substrate is a photomask blank that is a material of a photomask obtained by forming a light shielding pattern on a transparent substrate.

6. The method of manufacturing a substrate having a resist film according to claim 4, wherein the height from the liquid level of the resist agent in the liquid tank to the top end of the coating nozzle is set to be equal to or more than a distance of a capillary gap, and to be less than 45 times the distance of the capillary gap, said distance of a capillary gap being a distance of a gap in the coating nozzle in which capillary phenomenon occurs.

7. A method of manufacturing a substrate having a resist film on a surface thereof comprising:
    resist agent coating steps of:
    raising liquid resist agent stored in a liquid tank by a capillary phenomenon to a top portion of a coating nozzle,
    orienting a surface of the substrate to be coated in a downward-facing direction, and with a separation from the top portion of the coating nozzle sufficient to having a predetermined coating gap formed between the surface and a top portion of the coating nozzle, and
    performing a relative scan between the coating nozzle and the surface while the resist agent raised by the coating nozzle is in contact with the surface, thereby forming a coating film,
    wherein the substrate is a rectangle substrate, one of sides of which has a length that is equal to or more than 300 mm; and a thickness of the coating film is set at a value selected from a range from 200 nm to 2000 nm, and the coating gap is set to be equal to or more than 300 µm, so that a film thickness distribution rate of the coating film in a region, of which area is at least 70% of area of the substrate, is equal to or less than 0.5%.

8. The method of manufacturing a substrate having a resist film according to claim 7, wherein the substrate is a photomask blank that is a material of a photomask obtained by forming a light shielding pattern on a transparent substrate.

9. The method of manufacturing a substrate having a resist film according to claim 7, wherein the height from the liquid level of the resist agent in the liquid tank to the top end of the coating nozzle is set to be equal to or more than a distance of a capillary gap, and to be less than 45 times the distance of the capillary gap, said distance of a capillary gap being a distance of a gap in the coating nozzle in which capillary phenomenon occurs.

\* \* \* \* \*